United States Patent [19]

Schilling et al.

[11] Patent Number: 5,045,481
[45] Date of Patent: Sep. 3, 1991

[54] METHOD OF MANUFACTURING A SOLAR CELL

[75] Inventors: Roland Schilling, Gemmingen; Karl-Heinz Tentscher, Heilbronn, both of Fed. Rep. of Germany

[73] Assignee: TELEFUNKEN electronic GmbH, Heilbronn, Fed. Rep. of Germany

[21] Appl. No.: 563,821

[22] Filed: Jul. 30, 1990

Related U.S. Application Data

[62] Division of Ser. No. 839,172, Mar. 13, 1986, abandoned.

[30] Foreign Application Priority Data

Mar. 27, 1985 [DE] Fed. Rep. of Germany ....... 3511082

[51] Int. Cl.$^5$ .............................................. H01L 31/18
[52] U.S. Cl. ........................................ 437/2; 136/244; 136/256
[58] Field of Search .................................. 437/2-5; 136/244, 256

[56] References Cited

U.S. PATENT DOCUMENTS

| | | | |
|---|---|---|---|
| 3,378,407 | 4/1968 | Keys | 136/244 |
| 3,483,038 | 12/1969 | Hui et al. | 357/75 |
| 3,615,855 | 10/1971 | Smith | 136/255 |
| 4,416,052 | 11/1983 | Stern | 437/5 |
| 4,652,693 | 3/1987 | Bar-On | 136/251 |
| 4,915,743 | 4/1990 | Schilling | 136/256 |

FOREIGN PATENT DOCUMENTS

| | | | |
|---|---|---|---|
| 2334164 | 2/1974 | Fed. Rep. of Germany | 136/256 |
| 2919041 | 11/1980 | Fed. Rep. of Germany | 136/256 |
| 3303312 | 9/1983 | Fed. Rep. of Germany | 136/244 |
| 3235493 | 3/1984 | Fed. Rep. of Germany | 136/251 |
| 3303926 | 8/1984 | Fed. Rep. of Germany | 136/244 |
| 2520558 | 7/1983 | France | 136/244 |
| 61-292380 | 12/1986 | Japan | 136/256 |

OTHER PUBLICATIONS

Lanudis et al., IEEE Transactions on Components, Hybrids and Manufacturing Technology vol. CHMT-2, No. 3, Sep. 1979, pp. 350-355.

Primary Examiner—Aaron Weisstuch
Attorney, Agent, or Firm—Spencer & Frank

[57] ABSTRACT

The invention relates to a solar cell which consists of a doped semiconductor base body and metallic connection contacts on the front and rear sides. For interconnection with further solar cells to form solar modules in series or parallel connection, at least one of the connection contacts comprises a connector contact which is homogeneously integrated with it, protrudes from the semiconductor base body and is deformable.

9 Claims, 4 Drawing Sheets

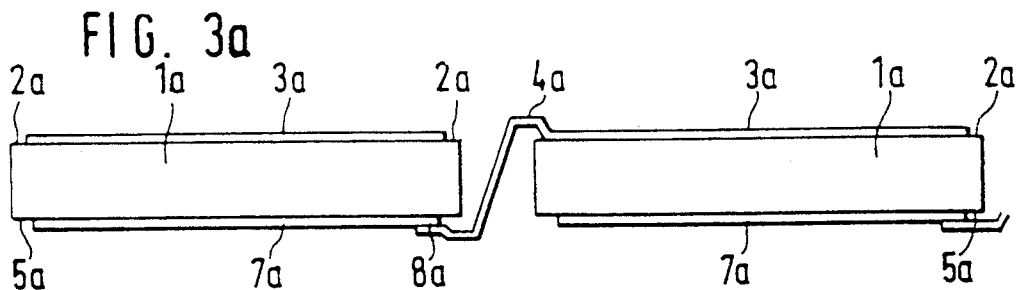
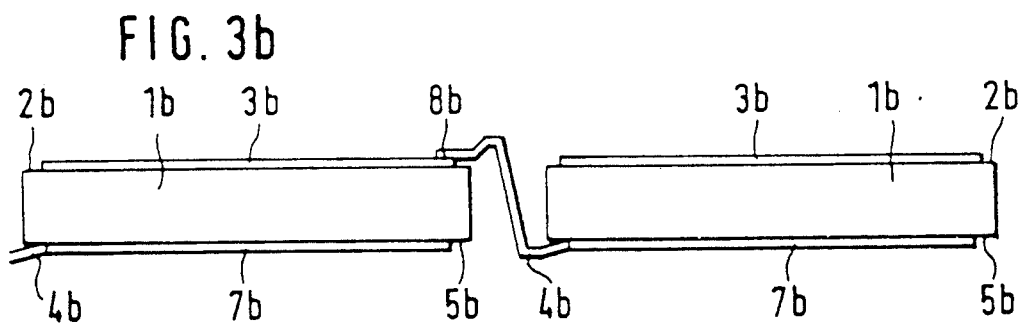
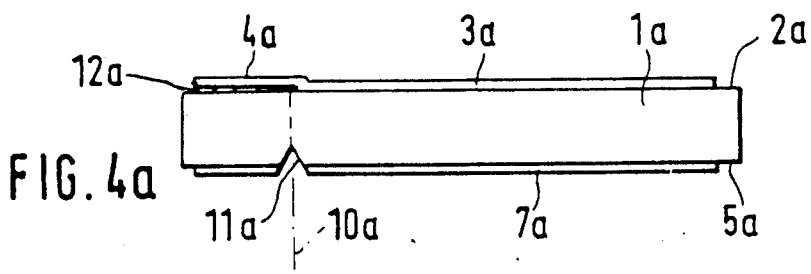
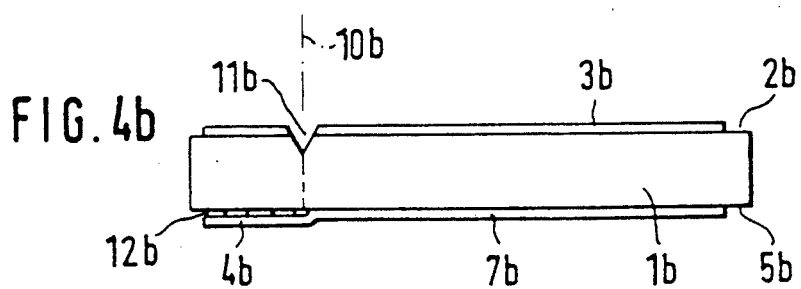

5,045,481

METHOD OF MANUFACTURING A SOLAR CELL

This application is a division of application Ser. No. 06/839,172, filed Mar. 13, 1986, now abandoned.

BACKGROUND OF THE INVENTION

The invention relates to a solar cell consisting of a doped semiconductor base body, a front surface provided for the incident light and metallic connection contacts for the front surface and for the opposite rear side.

More and more fields of use are developing for solar cells for supplying electrical systems with current, independent of the mains voltage. The efficiency data of the solar cells used, their operating voltages and generator currents are, inter alia, important criteria. In order to increase the operating voltage, single solar cells are interconnected in series. To this end, the metallic connection contact on the surface of a solar cell is, for example, electrically connected to the connection contact on the rear side of a further solar cell.

An increase in the generator current is, for example, obtained by several single solar cells being interconnected in parallel or by "strings" connected in series which are themselves connected in parallel. In these interconnections of single solar cells to form solar modules, the electrical connecting elements are of decisive importance.

German Offenlegungsschrift 3 303 926 discloses a solar cell wherein a metallic connector is mechanically attached as a front side contact on a conduction path system so that the connector protrudes beyond the disc edge of the solar cell.

The solar modules interconnected by means of these connectors have attained a high degree of reliability, but also require a certain expenditure with respect to the connectors and the connection technique.

The object underlying the present invention is, therefore, to provide a solar cell structure with connector contacts, which enables further improvement of the manufacture of solar modules.

SUMMARY OF THE INVENTION

This object is attained in accordance with the invention in that at least one of the metallic connection contacts comprises a connector contact which is homogeneously integrated with it and protrudes from the semiconductor base body.

This may be effected in advantageous further developments in that the metallic connection contact and the connector contact are produced as a coherent piece by means of a metallization mask by a vaporization process in high vacuum.

An essential advantage of the inventive solar cell and its manufacturing process is that no otherwise commonly used, separate connector elements are required.

Further advantageous embodiments of the invention are apparent from the subclaims.

BRIEF DESCRIPTION OF THE DRAWINGS

Embodiments of the invention are illustrated in the drawings and shall be explained in further detail hereinafter:

FIG. 3a shows the interconnection of two solar cells by means of a connector contact which is integrated with the metallic connection contact of the surface;

FIG. 3b shows the interconnection of two solar cells by means of a connector contact which is integrated with the metallic connection contact of the rear side;

FIG. 4a shows the separating of the connector contact arranged on the front surface from a part of the semiconductor base body;

FIG. 4b shows the separating of the connector contact arranged on the rear side from a part of the semiconductor base body;

DESCRIPTION OF THE PREFERRED EMBODIMENTS

Figure 1:
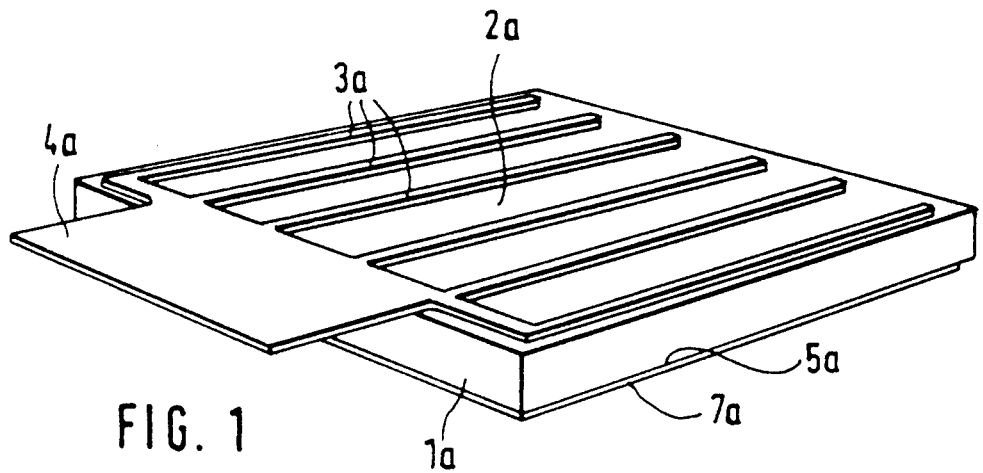
FIG. 1 shows a solar cell with a connector contact, integrated with the metallic connection contact on the front surface.

A perspective illustration of a solar cell with an integrated connector contact is shown in FIG. 1. This is a solar cell with a doped semiconductor base body 1a, in which a pn junction is provided. Its front surface 2a for the incident light is covered by a metallic connection contact 3a exhibiting a comb-type structure. This results in an optimum with respect to minimum surface shadowing and a maximum transition conductance value between semiconductor base body 1a and metallic connection contact 3a. The comb-type metallic connection contact 3a verges at its web arranged at the edge of the surface 2a parallel to an edge of the semiconductor base body 1a into a rectangularly shaped surface 4a which protrudes beyond the semiconductor base body 1a and is thereby deformable. It is thus homogeneously integrated with the connection contact 3a as a connector contact. Arranged on the rear side 5a of the semiconductor base body 1a is a further metallic connection contact 7a which covers the entire rear side 5a.

The metallic connection contacts 3a and 7a and also the connector contact 4a preferably consist of a titanium-palladium-silver layer system with a layer thickness of between 4 and 13 μm.

Figure 2:
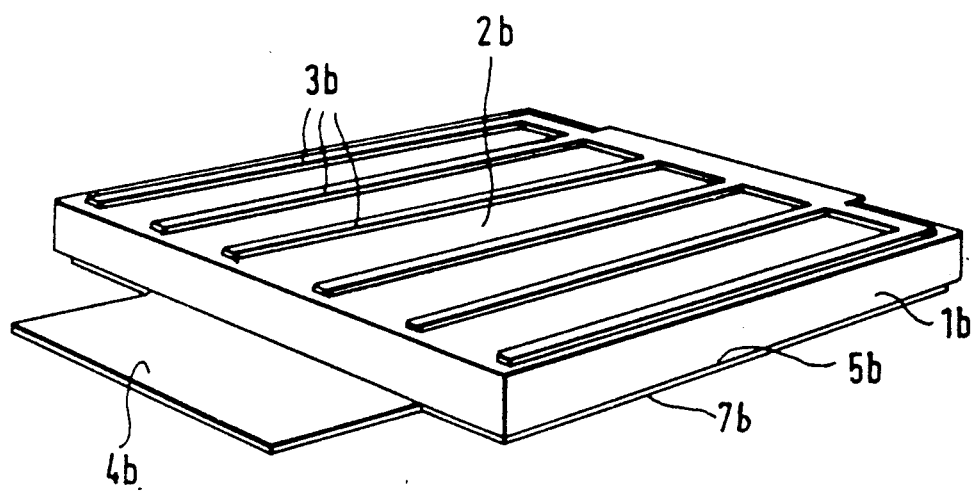
FIG. 2 shows a solar cell with a connector contact, integrated with the metallic connection contact on the rear side.

A modification for a further type of arrangement of the connector contact is shown in FIG. 2. Here again, a solar cell is produced by doping a semiconductor base body 1b to form a pn junction.

The front surface 2b provided for the incident light is covered by metallic connection contacts 3b which exhibit a comb-type structure and are designed in accordance with the optimization described in FIG. 1 with respect to surface shadowing and transition conductance value. Arranged on and covering the entire rear side 5b is a metallic connection contact 7b which verges at an edge of the semiconductor base body 1b into a rectangular, protruding and thus deformable connector contact 4b which is thereby homogeneously integrated with the connection contact 3b. The data given in connection with FIG. 1 apply to the thickness dimensions and material compositions.

FIG. 3a shows a principal type of interconnection of solar cells which are designed in accordance with FIG.

1. The connector contact 4a at the surface of a solar cell for the series connection is attached in an electrically conducting manner by soldering, welding, adhesion (gluing) or ultrasonic welding to the metallic connection contact 7a of a further solar cell at a contact connecting point 8a provided therefor. The cross-section of the connector contact 4a which in accordance with the invention is deformable, is of a pre-formed s-shape in order to counter thermally caused expansions of the solar module.

FIG. 3b shows a principal type of series interconnection of solar cells which are designed in accordance with FIG. 2. The connector contact 4b on the rear side of a solar cell is attached in an electrically conducting manner to the metallic connection contact 3b of a further solar cell at a contact connecting point 8b provided therefor. The cross-section of the connector contact is likewise preferably of a pre-formed s-shape.

The manufacture of a solar cell with a structural design in accordance with FIG. 1 shall be explained with reference to FIG. 4a. After the doping of the semiconductor base body 1a on a wafer disc, a metallic connection contact covering the entire surface is disposed on the rear side 5a. On the front surface 2a, a strip 12a is produced at an edge zone to prevent an adhesive or sinter bonding of metallic compounds or alloys to the semiconductor base body 1a. This strip 12a which can be produced by a photolithographic process, is at least equally large in its dimensions and has the same surface area as the surface of the connector contact 4a to be produced. The strip 12a may preferably consist of vapor deposited silver, photoresist or silicon dioxide. Via a metallization mask which is not illustrated, the metallic connection contact 3a including the connector contact 4a is homogeneously and coherently produced by a vaporization process in high vacuum on the strip 12a and the surface 2a. In view of the material composition of connection contact and connector contact, the vaporization takes place successively with the various materials such as Ti, Pd, Ag. The contact and connector material is sintered by a subsequent annealing process. The metallization mask is oriented in such a way that the connector contact 4a does not protrude beyond the strip 12a at any point. Via a laser or saw separating process, there is imparted to the metallic connection contact 7a on the rear side 5a and to the semiconductor base body 1a a v-shaped groove 11a symmetrically to a breaking edge 10a which in its extension delimits the strip 12a from the connection contact 3a which adjoins it. The depth of the v-shaped groove 11a is approximately one third of the thickness of the semiconductor base body 1a. By breaking along the breaking edge 10a, the part of the semiconductor base body 1a located beneath the strip 12a is severed, so that the connector contact 4a protrudes from the now remaining semiconductor base body 1a.

FIG. 4b shows the way in which the connector contact 4b is manufactured in a solar cell exhibiting the structure shown in FIG. 2.

At an edge zone on the rear side 5b, a strip 12b which prevents an adhesive or sinter bonding of metallic compounds or alloys with the semiconductor base body 1b is produced. This strip 12b is at least equally large in its dimensions and has the same surface area as the surface of the connector contact 4b. The strip 12b may preferably consist of silver, photoresist or silicon dioxide. Via a metallization mask which is not illustrated, the metallic connection contact 7b including the connector contact 4b is homogeneously and coherently produced in accordance with the structure shown in FIG. 2 by a vaporization process in high vacuum on the strip 12b and the rear side 5b. The metallization mask is oriented as in the process described with reference to FIG. 4a. Via a laser separating process there is imparted to the metallic connection contact 3b on the front surface 2b and to the semiconductor base body 1b a v-shaped groove 11b symmetrically to a breaking edge 10b which in its extension delimits the strip 12b from the connection contact 7b adjoining it. The depth of the v-shaped groove 11b is approximately one third of the thickness of the semiconductor base body 1b. By breaking along the breaking edge 10b, the part of the semiconductor base body 1b located above the strip 12b is severed so that the connector contact 4b protrudes from the now remaining semiconductor base body 1b.

On account of the material composition and the dimensions, the connector contacts 4a, 4b are also deformable.

Figure 5:
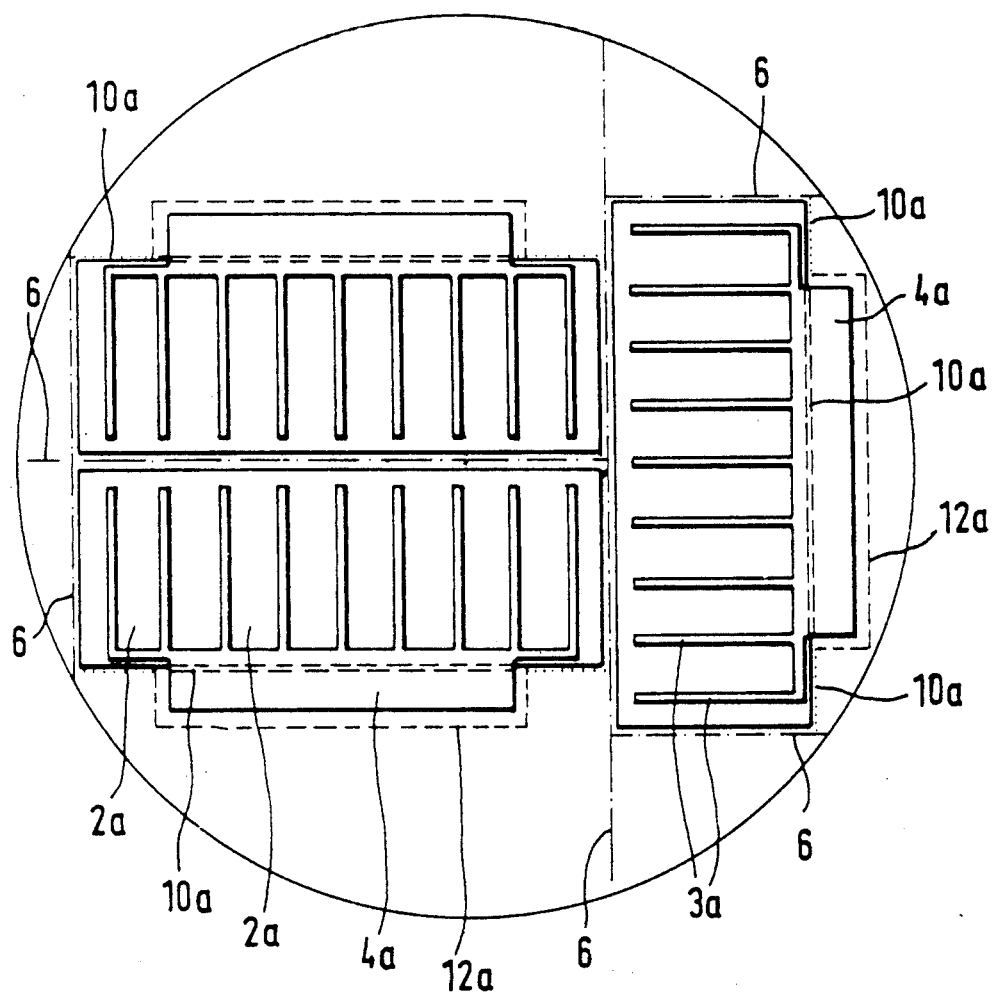
FIG. 5 shows the arrangement of single solar cells on a wafer disc.

FIG. 5 shows the arrangement of the inventive solar cells on a wafer disc. To enable optimum surface usage of the wafer disc, two solar cells with a structural design as shown in FIG. 1 are arranged, for example, in mirror symmetry and a third solar cell adjoins them at right angles. The contours of the single solar cells are produced by means of v-shaped laser grooves 6 and 10a, respectively, on the metallic connection contact 7a of the rear side 5a and subsequent breaking.

Figure 6:
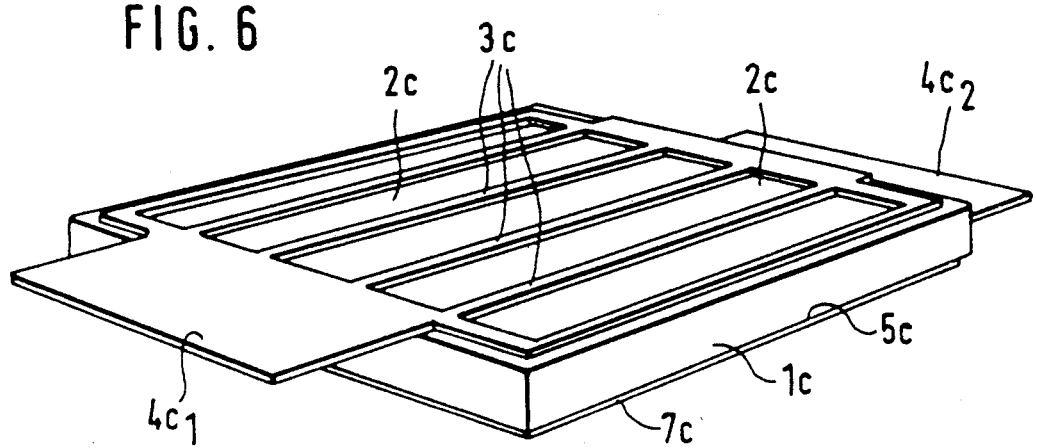
FIG. 6 shows a solar cell with connector contacts, integrated with respective metallic connection contacts on the front surface and the rear side.
Figure 7:
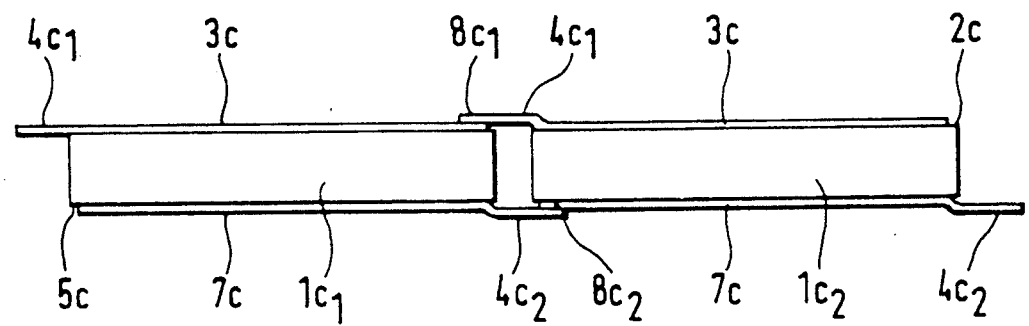
FIG. 7 shows the interconnection of two solar cells with a structure as illustrated in FIG. 6, to form a parallel connected module.

The solar cell shown in FIG. 6 comprises on the front surface 2c and the rear side 5c one protruding connector contact $4c_1$ and $4c_2$, respectively, which are arranged diametrically in relation to each other on a doped semiconductor base body 1c. The connector contacts $4c_1$ and $4c_2$ are homogeneously integrated with the respective connection contacts 3c and 7c. A solar cell with this structure is suitable, for example, for a parallel interconnection of two or several solar cells as shown in FIG. 7 to form modules.

The connector contact $4c_2$ of the connection contact 7c on the rear side of a solar cell with the semiconductor base body $1c_1$ is attached in an electrically conducting manner to the metallic connection contact 7c of a further solar cell with the semiconductor base body $1c_2$ at a contact connecting point $8c_2$.

In analogy, the connector contact $4c_1$ of the further solar cell with the semiconductor base body $1c_2$ is attached in an electrically conducting manner to the connection contact 3c of the first solar cell at a contact connecting point $8c_1$.

In practice, another possibility of interconnecting several solar cells in parallel to form modules is to first connect in series a certain number of solar cells, for example, four in each case, and to arrange in parallel and connect in parallel these thus obtained "strings" with additional connector contacts which are not illustrated.

The layer thicknesses of the connection contacts 3a, 3b, 3c, 7a, 7b, 7c and also the connector contacts 4a, 4b, $4c_1$, $4c_2$ is between 4 μm and 13 μm. The thickness of the strips 12a, 12b in the case of silver is in the order of magnitude of less than 1 μm, in the case of photoresist less than 5 μm and in the case of silicon dioxide less than 1 μm.

The connector contacts 4a, 4b, $4c_1$, $4c_2$ have—in relation to the surfaces 2a, 5b, 2c, 5c—a surface fraction of approximately 30%.

In one embodiment, the connector contact 4a measures 15 mm×30 mm.

It is also advantageous for the connector contacts 4a, 4b, 4c to be of finger-shaped design, and they may be structured in themselves to compensate for thermally caused expansions.

What is claimed is:

1. A process for manufacturing a solar cell from a semiconductor body, comprising the steps of:

providing a semiconductor base body having first and second opposing major surfaces, wherein an edge zone is defined along an edge of the first major surface of said semiconductor body;

depositing a strip-shaped region on said edge zone, said strip-shaped region preventing bonding of metallic compounds or alloys to said semiconductor base body;

depositing by vaporization a first metallic connection contact on said strip-shaped region and on the first major surface of said semiconductor body, said strip-shaped region preventing said first metallic connection contact from adhering to said semiconductor body;

depositing a second metallic connection contact on the second major surface of said semiconductor body, one of said first and second metallic connection contacts having a comb-like structure; and severing the portion of the semiconductor body at said edge zone from the remainder of said semiconductor body, whereby said first metallic connection contact projects over the edge of the resulting solar cell.

2. The process defined by claim 1 wherein the step of depositing said strip-shaped region on said semiconductor body is effected by a photolithography process.

3. The process defined by claim 2 wherein the step of severing the portion of the semiconductor body at the edge zone from the remainder of said semiconductor body comprises the substeps of cutting a groove in the second surface of said semiconductor body at said edge zone with one of a laser or saw; and breaking said portion of said semiconductor body from the remainder of said body at said groove to sever said portion.

4. The process defined by claim 1 wherein the step of severing the portion of the semiconductor body at the edge zone from the remainder of said semiconductor body comprises the substeps of cutting a groove in the second surface of said semiconductor body at said edge zone with one of a laser or saw; and breaking said portion of said semiconductor body from the remainder of said body at said groove to sever said portion.

5. The process defined by claim 4 wherein the depth of said groove is approximately one-third the thickness of said semiconductor body.

6. The process defined by claim 1 wherein the step of depositing said strip-shaped region on said edge zone is effected by vapor depositing one of silver, photoresist, and silicon dioxide.

7. The process defined by claim 1 wherein said first metallic connection contact has a comb-like structure.

8. The process defined by claim 1 wherein said second metallic connection contact has a comb-like structure.

9. The process of interconnecting two solar cells manufactured by the process defined by claim 1 wherein the first metallic contact of one cell is fastened to the second metallic contact of the other cell by one of soldering, welding, adhesion, and ultrasound welding.

* * * * *